United States Patent [19]

Sumi

[11] Patent Number: 5,700,722
[45] Date of Patent: Dec. 23, 1997

[54] PROCESS FOR FORMING SILICIDE PLUGS IN SEMICONDUCTOR DEVICES

[75] Inventor: Hirofumi Sumi, Kanagawa, Japan

[73] Assignee: Sony Corporation, Tokyo, Japan

[21] Appl. No.: 591,913

[22] Filed: Jan. 25, 1996

Related U.S. Application Data

[63] Continuation of Ser. No. 101,760, Aug. 4, 1993, abandoned.

[30] Foreign Application Priority Data

Aug. 6, 1992 [JP] Japan .................. P04-229487

[51] Int. Cl.⁶ .................................................. H01L 21/44
[52] U.S. Cl. .......................... 437/200; 437/203; 148/19
[58] Field of Search .......................... 437/200, 203; 148/19

[56] References Cited

U.S. PATENT DOCUMENTS

| | | | |
|---|---|---|---|
| Re. 32,613 | 2/1988 | Lepselter et al. | 437/29 |
| 4,647,361 | 3/1987 | Bauer | 437/200 |
| 4,818,723 | 4/1989 | Yen | 437/200 |
| 4,966,868 | 10/1990 | Murali et al. | 437/193 |

FOREIGN PATENT DOCUMENTS 0170030  7/1986  Japan .................. 437/200

OTHER PUBLICATIONS

Wolf et al., vol. II, Silicon Processing for the VLSI Era, Lattice Press, 1990.

*Primary Examiner*—Charles L. Bowers, Jr.
*Assistant Examiner*—Lynne A. Gurley
*Attorney, Agent, or Firm*—Hill, Steadman & Simpson

[57] ABSTRACT

A process for forming a uniform silicide plug inside an opening in a semiconductor to form fine contacts is disclosed wherein a silicon based material which is inserted into a hole formed in a substrate is reacted with a metal layer to form the contacts.

3 Claims, 3 Drawing Sheets

PROCESS FOR FORMING SILICIDE PLUGS IN SEMICONDUCTOR DEVICES

This is a continuation of application Ser. No. 08/101,760 filed Aug. 4, 1993 now abandoned.

BACKGROUND OF THE INVENTION

1. Field of the Invention

The present invention relates to a process for forming silicide plugs in a semiconductor device to electrically connect a lower connection layer with an upper connection layer.

2. Prior Art

The present demand for increasing the scale of integration in semiconductor devices has led to the development of still finer semiconductor elements. Accordingly, it is also required to form finer contact holes, via holes, and through holes (all referred to collectively hereinafter as "contact holes") in the semiconductor elements. In general, the contact holes are provided by a process which comprises forming an interlayer insulating layer on a lower connection layer, providing an opening in the interlayer insulating layer, and filling the opening with a metallic connection material. The finer the opening is provided, however, the more difficult it becomes to fill the opening with the metallic connection material.

In general, aluminum or an aluminum alloy (the term "aluminum alloy" encompasses both aluminum and an alloy thereof hereinafter) is used as the metallic connection material for filling the opening. Recently, the technology of filling the opening by means of high temperature sputtering of aluminum has attracted much attention. The technology comprises depositing a film of an aluminum alloy by sputtering while heating the semiconductor substrate to a temperature of several hundred degrees, and reflow melting the deposited aluminum alloy inside the opening to thereby fill the opening and plain finish the filled surface.

When the high temperature aluminum sputtering process is used for filling the opening with an aluminum alloy to establish an electric connection with the diffusion layer having formed on the silicon substrate, the base diffusion layer must be protected against penetration of the aluminum alloy. Accordingly, a barrier metal layer comprising Ti/TiON and the like must be formed on the diffusion layer as the base for the aluminum alloy. The aluminum alloy is formed on TiON having established on the barrier layer.

In general, favorable filling characteristics can be obtained when aluminum alloy is established on titanium, because it has good wettability to titanium. In contrast to this, aluminum alloy exhibits poor wettability to TiON because it hardly undergoes reaction therewith. Accordingly, an extremely unfavorable filling results if TiON is used as the base.

A barrier metal layer comprising Ti/TiON/Ti may be formed on the diffusion layer as the base for aluminum alloy. A more favorable, but still insufficient, filling of aluminum alloy can be established this time as compared with the case in which Ti/TiON is used as the barrier metal layer. When TiN is used as the barrier metal layer, a better filling of aluminum alloy can be certainly achieved. However, TiN functions insufficiently as a barrier when compared with TiON, because TiN allows the aluminum alloy to penetrate through the diffusion layer. Furthermore, it is extremely difficult to form a uniform TiN or TiON layer inside the fine opening.

There is also known a technology for electrically connecting the lower connection layer with the upper connection layer by forming, inside the opening, a plug made from a connection material. A process of this type of technology comprises depositing polysilicon by Low Pressure-Chemical Vapor Deposition (LP-CVD) on the interlayer insulating layer inclusive of the opening, and carrying out etch back process thereafter to form a plug on the opening. However, this process suffers increase of the connection resistance due to the high resistivity of polysilicon which amounts to 100 μΩ•cm or even higher.

As a means for overcoming the aforementioned problems, there is actively studied a method of forming a silicide plug inside the opening in the place of using a polysilicon plug (see, for example, *Silicide Plugs for Contact Hole Filling*, Proc. of Autumn Meeting, The Society of Applied Physics of Japan, 11a-D-4). The outline of this method is described below.

An isolation region 12 is formed on a semiconductor substrate 10 by a conventional process. After thermally oxidizing the surface of the semiconductor substrate, a gate oxide film 14 is formed thereon.

A gate contact area 22 having a Lightly Doped Drain (LDD) structure and comprising a gate oxide film 14, a polysilicon layer 16, a $WSi_2$ layer 18, and a side wall 20 is established on the semiconductor substrate 10. Ion implantation is conducted thereafter to form source•drain regions 24.

After depositing an interlayer insulating layer 26 over the entire surface of the resulting structure and resist patterning, an opening 28 is provided in the interlayer insulating layer 26 by dry etching. Thus is obtained a semiconductor element having a structure as shown in FIG. 4(A), in which a schematic partial cross section is provided.

Polysilicon is deposited over the entire surface of the structure thus obtained, to thereby fill the opening 28 with polysilicon 50. Polysilicon 50 is left over only inside the opening 28 by carrying out etch back over the surface. The resulting structure is illustrated in FIG. 4(B).

The surface of the interlayer insulating layer 26 inclusive of the polysilicon layer 50 having deposited inside the opening 28 is wholly covered with a nickel layer 52 by deposition. Thus is obtained a structure shown in FIG. 4(C).

The nickel layer 52 having deposited on the polysilicon layer 50 is then subjected to reaction with polysilicon by heat treatment. In this manner, a silicide ($NiSi_2$) layer 54 is formed. The nickel 52 remaining un-reacted with polysilicon on the interlayer insulating layer 26 is removed thereafter by etching. Thus is obtained a structure illustrated in FIG. 4(D), having an $NiSi_2$ plug 54 formed inside the opening 28. In general, an insufficiently reacted region 54A forms at the same time at the lower side of the plug.

A Ti/TiON/Ti three-layered barrier metal layer and an upper aluminum connection layer are established thereafter. After subjecting the resulting structure to resist patterning, dry etching is conducted to remove the unnecessary aluminum layer having deposited on the interlayer insulating layer 26 and the barrier metal layer to obtain an upper connection. The ordinary process steps are followed thereafter to finish the structure into a semiconductor device.

The $NiSi_2$ plug thus obtained yields a resistivity as low as 20 μm•cm or even lower. It is, therefore, a practically feasible plug for a semiconductor device. However, when the process above is considered as a one for mass production, the surface of the polysilicon layer 50 having deposited on the opening 28 becomes uneven ascribed to the non-uniform etch back, and this inconvenience is attributed to polysilicon 50 which is left over inside the opening 50 by conducting etch back over the entire surface as described above. This results in a non-uniform nickel coverage when nickel is deposited, and is hence followed by the formation of a non-uniform $NiSi_2$ plug 54 which step is conducted thereafter. It is also a problem that the lower portion of the plug remains as an insufficiently reacted silicide.

As mentioned in the foregoing, the semiconductor devices obtained heretofore by the conventional processes still suffer problems to be solved.

SUMMARY OF THE INVENTION

An object of the present invention is to provide a process which enables mass production of semiconductor devices furnished with openings filled with uniform silicide plugs which provide fine contact holes.

The aforementioned object of the present invention can be accomplished by a process according to a first embodiment of the present invention, which comprises:

forming an opening in an interlayer insulating layer having formed on a lower connection layer;

depositing a silicon based material inside said opening; and depositing a metal on the silicon based material having deposited inside the opening while maintaining the silicon based material having deposited inside the opening to a temperature at which said silicon based material undergoes reaction with said metal, to thereby form a silicide plug inside the opening through the reaction of said silicon based material and said metal.

The object above can be accomplished also by a process according to a second embodiment of the present invention, which comprises conducting subsequent to the steps described in the first embodiment, the steps of:

removing the metal having kept intact in the reaction with the silicon based material; and heat treating the silicide plug.

DETAILED DESCRIPTION OF THE INVENTION

In the process according to the first or the second embodiment of the present invention, the metal is preferably selected from the group consisting of zirconium (Zr), hafnium (Hf), cobalt (Co), nickel (Ni), palladium (Pd), platinum (Pt), copper (Cu), gold (Au), and silver (Ag).

The lower connection layers refer to various types of connection layers made from a semiconductor material or a metallic material inclusive of source-drain regions and lower parts of gate contact areas, contact holes, via holes, or through holes. Silicon based materials include, for example, polysilicon.

In general, a silicide of a refractory metal, such as $WSi_2$ and $MoSi_2$, is formed mainly by the reaction between the refractory metal and the silicon atoms which diffuse into the refractory metal. That is, the heat treatment induces diffusion of silicon atoms from the semiconductor substrate into the refractory metal to form therein the silicide. In contrast to this reaction mechanism, the formation of a silicide of a transition metal such as $CoSi_2$, $NiSi_2$, and PdSi depends mainly on the diffusion of the transition metal atoms which occurs during the reaction. In short, the heat treatment in this case promotes the transition metal atoms to diffuse into silicon to form a silicide of a transition metal. The present invention comprises forming silicide plugs based on those mechanisms. More briefly, the process for forming silicide plugs according to the present invention is based on the diffusion phenomenon of metals.

Figure 3:
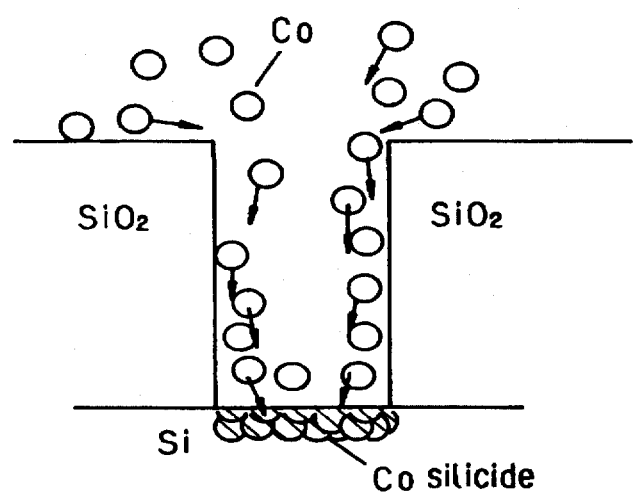
FIG. 3 is a schematically drawn cross sectional view of a part of semiconductor element according to a process for forming a silicide plug according to the present invention.
Figure 4A:
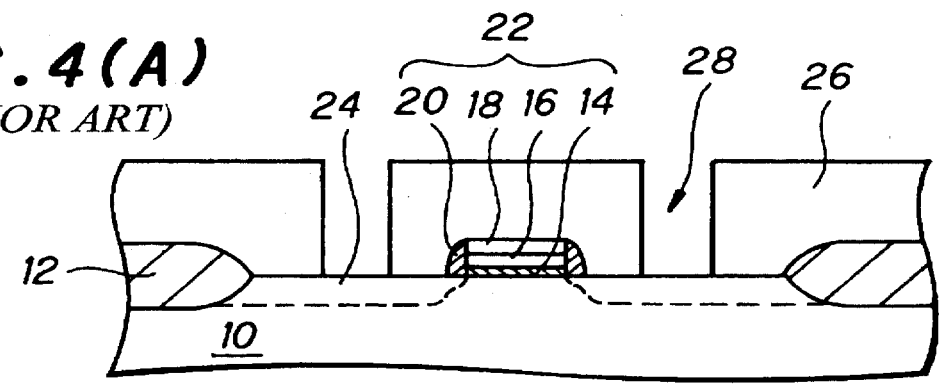
FIG. 4(A) is a schematic cross-sectional view of a semiconductor element which has undergone partial processing in accordance with a conventional process.
Figure 4B:
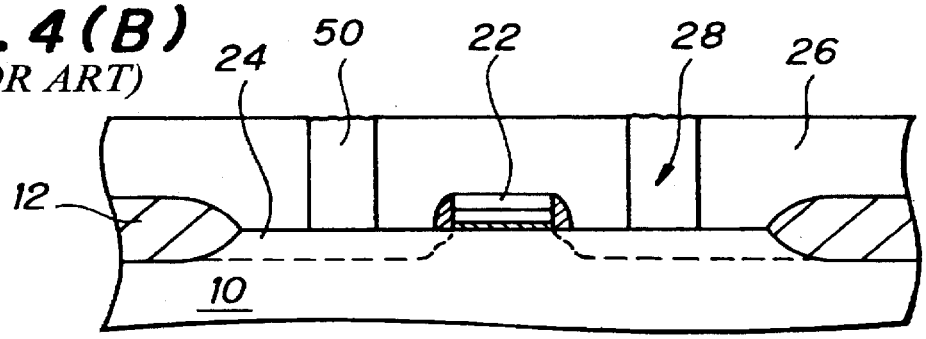
FIG. 4(B) is a schematic cross-sectional view of a semiconductor element which has undergone partial processing in accordance with a conventional process.
Figure 4C:
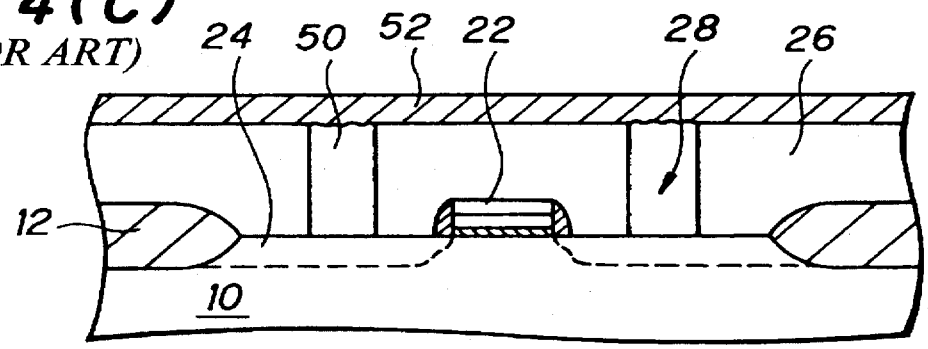
FIG. 4(C) is a schematic cross-sectional view of a semiconductor element which has undergone partial processing in accordance with a conventional process.
Figure 4D:
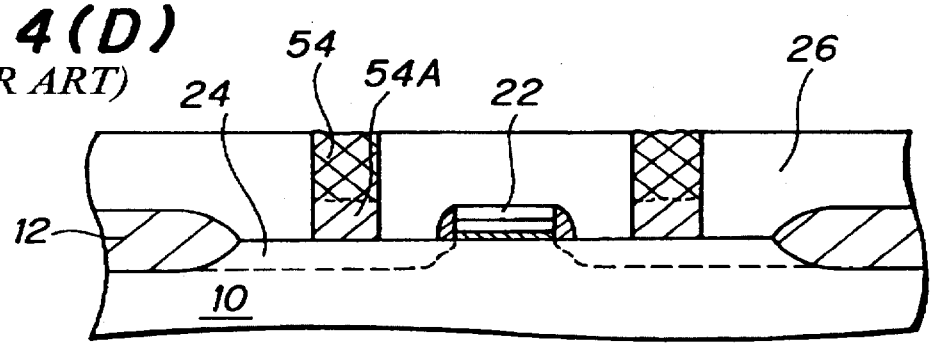
FIG. 4(D) is a schematic cross-sectional view of a semiconductor element which has undergone partial processing in accordance with a conventional process.

As can be seen from the schematic view of FIG. 3, an opening as fine as the one shown in the figure can be filled with a metal only by positively allowing the metal atoms to diffuse inside the opening. Since the process for forming the silicide plug according to the present invention comprises depositing a metal inside the opening while maintaining the silicon based material to a predetermined temperature, the metal and the silicon based material immediately undergo reaction to actively allow the metal atoms to diffuse into the silicon material. In this manner, the diffusion of the metal occurs uniformly inside the silicon based material of the opening, which, as a result, provides a homogeneous silicide inside the opening. Furthermore, an excellent metal coverage with respect to the silicon based material can be obtained by the process for forming a silicide plug according to the present invention, because it comprises maintaining the silicon based material to a predetermined temperature while conducting metal deposition.

As described in the foregoing, the silicon based material must be maintained at a high temperature to effect reaction thereof with a metal. In a process using cobalt as the metal, for instance, the temperature of the silicon based material should be maintained at 550° C. or higher to allow the deposited metal to undergo reaction with the silicon based material. During the reaction, the atoms of the metal having deposited on the silicon based material diffuse inside the silicon based material while forming a silicide.

The present invention is illustrated in greater detail referring to non-limiting examples below and to schematically drawn cross sections. It should be understood, however, that the present invention is not to be construed as being limited thereto.

EXAMPLE 1

This example refers to a first embodiment of the present invention. Referring to FIGS. 1(A)–(D), the process steps are described in detail below, but firstly, a brief summary is given.

An opening 28 is formed in an interlayer insulating layer 26 having provided on a lower connection layer 24.

A silicon based material 30 is deposited inside the opening 28.

A silicide 34 is formed inside the opening 28 by the following steps. A metal layer 32 is deposited on the silicon based material 30 having deposited inside the opening 28 while maintaining the silicon based material to a temperature at which the silicon based material having deposited inside the opening undergoes reaction with said metal.

Now the process is described in detail step by step below.

Element isolation regions 12 were formed at first on a silicon semiconductor substrate 10 by an ordinary process. The entire surface of the resulting semiconductor substrate was subjected to thermal oxidation at, for example, 850° C., by flowing a mixed gas of $H_2$ and $O_2$ at an $H_2/O_2$ flowing ratio by liter per minute of 6/4 l/min, to obtain a gate oxide film 14 at a thickness of 16 nm.

A gate contact area was formed thereafter on the semiconductor substrate 10. This step comprises depositing a polysilicon layer 16 at a thickness of, e.g., 200 nm, over the entire surface of the semiconductor substrate 10, for instance, by chemical vapor deposition (CVD), by flowing a gas mixture of $SiH_4$, $PH_3$, and $H_2$ each at a flow rate of 500 sccm, 0.35 sccm, and 50 sccm, respectively, while maintaining the temperature to 580° C. and the pressure to 79.8 Pa. Then, a 100 nm thick $WSi_2$ layer 18 is deposited on the polysilicon layer 16 thus obtained by, for example, CVD, using a gas mixture $WF_6$, $SiH_4$, and He each being flown at a rate of 10 sccm, 1,000 sccm, and 360 sccm, respectively, while heating to 360° C. and maintaining the pressure to 26.6 Pa. The polysilicon layer 16 and the $WSi_2$ layer 18 are subjected to dry etching by carrying out resist patterning. Dry etching may be conducted using gases of $C_2Cl_3F_3$ and $SF_6$ at a flow ratio of 65 sccm and 5 sccm, respectively, under a microwave power of 100 W, an RF power of 100 W, and a pressure of 1.33 Pa. An LDD structure was then established by carrying out ion implantation to the portions destined for source•drain regions, and then forming a side wall 20 to the side walls of the polysilicon layer 16 and the $WSi_2$ layer 18. In this manner, a gate contact area 22 comprising a gate oxide film 14, a polysilicon layer 16, a $WSi_2$ layer 18, and a side wall 20 can be formed. Ion implantation was conducted thereafter to establish source-drain regions 24. The ion implantation process can be conducted by bombarding the structure, for example, with $As^+$ at an energy of 50 KeV and at a fluence of $5\times10^{15}$ ions/cm$^2$ for an NMOS, or with $BF_2^+$ at an energy of 20 KeV and at a fluence of $3\times10^{15}$ ions/cm$^2$ in the case of a PMOS. The step described herein is based on an ordinary process for fabricating a semiconductor element. In this Example, it can be seen that the lower connection layer corresponds to the source•drain regions 24.

A 500 nm thick $SiO_2$ layer was deposited over the entire structure as an interlayer insulating layer 26 by, for example, CVD, at 420° C. and under a pressure of 13.3 Pa while flowing a mixed gas comprising $SiH_4$, $O_2$, and $N_2$, each at a flow rate of 250 sccm, 250 sccm, and 100 sccm, respectively. After resist patterning, an opening 28 was then established in the interlayer insulating layer 26 by dry etching. The dry etching process can be conducted by flowing $C_4F_8$ gas at a flow rate of 50 sccm under a pressure of 2 Pa, while applying RF power of 1,200 W. Thus was obtained a semiconductor element the part of which is shown schematically in FIG. 1(A).

The process according to the present invention is characterized by the steps described hereinafter. A silicon based material comprising polysilicon was formed inside the opening 28. This was done by depositing a polysilicon layer by CVD on the interlayer insulating layer 26 inclusive of the opening 28. The CVD process can be conducted, for example, by flowing gases of $SiH_4$, He, and $N_2$ at a flow rate of 100 sccm, 400 sccm, and 200 sccm, respectively, at 610° C. and under a pressure of 70 Pa. The interlayer insulating layer 26 may be deposited to a thickness of, e.g., 400 nm. The entire surface of the thus deposited polysilicon layer is then subjected to etch back, using, for example, a mixture comprising gases of $C_2Cl_3F_3$ and $SF_6$ at a flow rate of 40 and 30 sccm, respectively, a microwave power of 700 W and an RF power of 50 W, under a pressure of 1.33 Pa. In this manner, a silicon based material 30 comprising polysilicon can be left over only inside the opening 28 as illustrated in FIG. 1(B). Thus was deposited a silicon based material 30 inside the opening 28.

A metal layer 32 comprising cobalt was deposited by sputtering on the entire surface of the interlayer insulating layer 26 inclusive of the silicon based material 30 having deposited inside the opening 28. The resulting structure is shown in FIG. 1(C). It should be noted that the semiconductor substrate is heated to about 600° C. during the deposition of the metal layer. The film deposition can be carried out, e.g., by applying a sputtering power of 1 kW, while flowing Ar gas at a flow rate of 40 sccm under a pressure of 0.04 Pa. The cobalt film is deposited to a thickness of 30 nm as measured on the interlayer insulating layer 26. By depositing a metal layer 32 comprising cobalt on the silicon based material 30 being maintained at a temperature of about 600° C., diffusion occurs as such that the metal atoms react one after another with the silicon atoms inside the silicon based material 30. In this manner, a silicide 34 is formed as a reaction product of the silicon based material and the metal, as illustrated in FIG. 1(D). More specifically, a silicide expressed by $CoSi_x$ is formed. Since the metal atoms undergoes diffusion inside the silicon based material 30 having formed in the opening 28, there is no problem of forming unfavorable coverage and overhang on depositing the metal by sputtering. The silicide 34 can be formed uniformly inside the opening 28. In this manner, a silicide plug is obtained inside the opening 28 as shown in FIG. 1(d).

The $CoSi_x$ thus obtained has a sufficiently low resistivity as to maintain a sheet resistance of 10 Ω or lower inside the opening. It is also possible to suppress the contact resistance between the silicide 34 and the aluminum upper connection layer to be formed in the next step to a value as low as 10 Ω or even lower.

A barrier metal layer not shown comprising Ti/TiON/Ti, and an aluminum upper connection layer also not shown thereon were formed. The Ti layer, which is 30 nm in thickness, can be deposited by sputtering under conditions of, for example, an Ar gas flow of 40 sccm, a sputtering power of 4 KW, and a pressure of 0.04 Pa. The 50 nm thick TiON layer can be deposited by sputtering using, for example, a gas mixture of Ar and $N_2$-6%$O_2$ each being flown at a rate of 40 sccm and 70 sccm, respectively, at a sputtering power of 5 kW under a pressure of 0.04 Pa. The aluminum layer, which is 500 nm in thickness, can be deposited by using, for example, Ar gas being flown at a rate of 100 sccm, applying a DC sputtering power of 22.5 kW and under a pressure of 0.04 Pa. This process was followed by resist patterning, and the upper connection was established by dry etching the unnecessary aluminum layer, barrier layer, and metal layer 30 having deposited on the interlayer insulating layer 26. The dry etching can be conducted using an ECR (electron cyclotron resonance)-applied etcher, for example, by using a mixed gas flow of $BCl_3$ and $Cl_2$ each at a flow rate of 60 sccm and 90 sccm, respectively, applying a microwave power of 1 kW and applying an RF power of 50 W under a pressure of 21.3 Pa. In this manner, a complete semiconductor device can be obtained by applying a process for forming silicide plugs according to the present invention.

EXAMPLE 2

This example refers to a second embodiment of the present invention. Referring to FIG. 2, the process steps are described in detail below, but firstly, a brief summary is given.

Figure 1A:
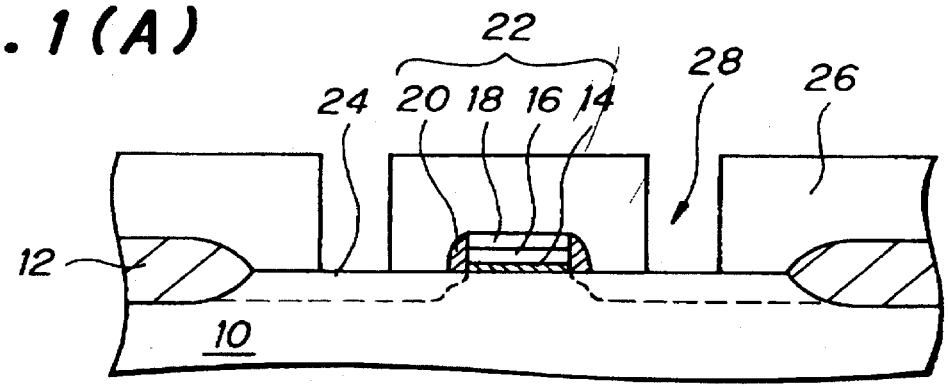
FIG. 1(A) is a cross-sectional view of a semiconductor element manufactured according to a first embodiment of the present invention which has undergone partial processing.
Figure 1B:
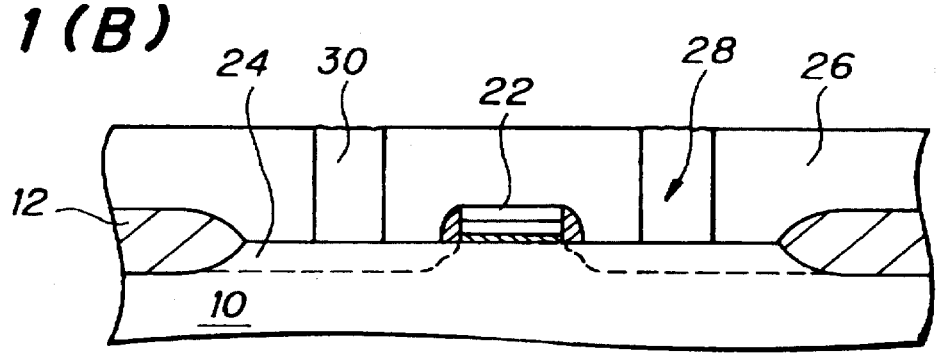
FIG. 1(B) is a cross-sectional view of a semiconductor element manufactured according to a first embodiment of the present invention which has undergone further processing according to the invention.
Figure 1C:
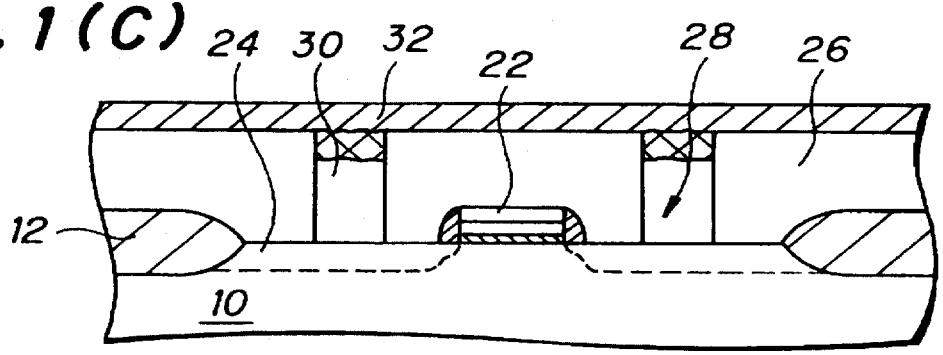
FIG. 1(C) is a cross-sectional view of a semiconductor element manufactured according to a first embodiment of the present invention which has undergone further processing according to the invention.
Figure 1D:
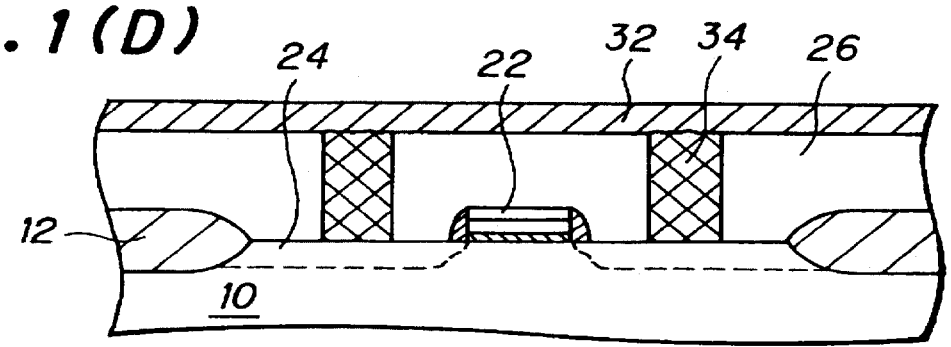
FIG. 1(D) is a cross-sectional view of a semiconductor element manufactured according to a first embodiment of the present invention which has undergone further processing according to the invention.

An opening 28 is formed in an interlayer insulating layer 26 having provided on a lower connection layer 24 similar to those illustrated in FIG. 1(a).

A silicon based material 30 is deposited inside the opening 28.

A silicide 34 is formed inside the opening 28. A metal layer 32 is deposited on the silicon based material 30 having deposited inside the opening 28 while maintaining the silicon based material to a temperature at which the silicon based material having deposited inside the opening may undergo reaction with said metal.

The metal having left intact in the reaction with the silicon based material is removed.

The silicide 34 is subjected to heat treatment.

These process steps are performed in a similar manner to the corresponding process steps described in example 1. Accordingly, the detail of these steps are not referred to here but the steps subsequent thereto are described in detail.

Figure 2A:
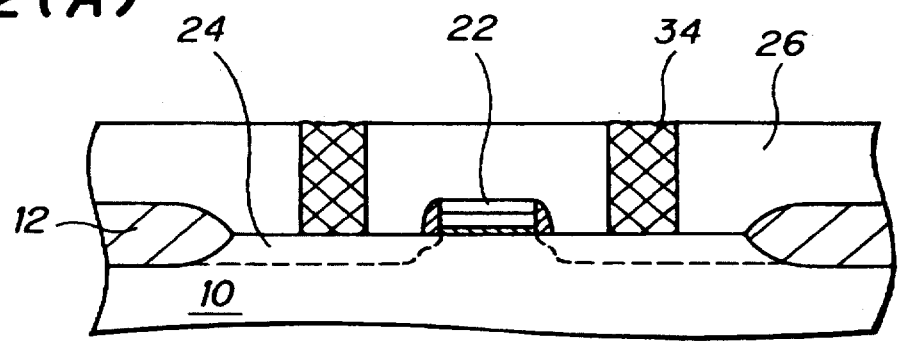
FIG. 2(A) is a cross-sectional view of a semiconductor element manufactured according to a second embodiment of the present invention which has undergone partial processing.
Figure 2B:
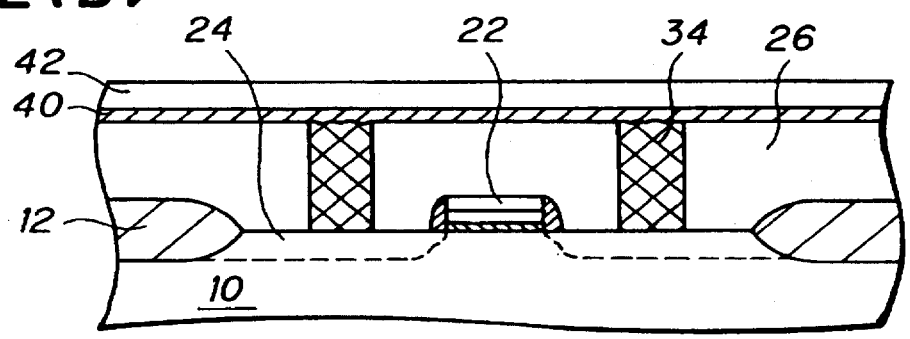
FIG. 2(B) is a cross-sectional view of a semiconductor element manufactured according to a first embodiment of the present invention which has undergone further processing according to the invention.

After forming a silicide 34 made from a silicide expressed by $CoSi_x$, the metal having deposited on the interlayer insulating layer 26 and kept intact in the reaction with the silicon based material 30 was etched selectively to obtain a structure shown in FIG. 2(A). This can be realized by immersing the entire semiconductor substrate into an etching solution comprising an aqueous solution of ammonia ($NH_4OH$) and hydrogen peroxide ($H_2O_2$), containing $NH_4OH$, $H_2O_2$, and $H_2O$ at an $NH_4OH:H_2O_2:H_2O$ ratio of 1:2:2 for a duration of 10 minutes.

After the etching, the silicide plugs are subjected to heat treatment at 800° C. for about 30 seconds to obtain a stable silicide ($CoSi_2$ in the present example).

A barrier metal layer 40 and an upper connection layer 42 were formed in a manner substantially similar to the corresponding step of Example 1. Thus was obtained a structure illustrated in FIG. 2(B). The only difference between this step and the corresponding step in example 1 is that the metal on the interlayer insulating layer 26 is removed in this current step.

The present invention was described referring to preferred modes of carrying out the invention, however, it should be understood that the present invention is not limited to the foregoing examples. In the examples above, source-drain region was referred as an example of the lower connection layer, however, the present invention is also applicable to the cases in which various types of connection layers such as connection layers made from semiconductor materials or metallic materials and formed under the gate contact area, contact holes, and via holes are used as the lower connection layer.

The present invention was exemplified in the foregoing referring to specific materials, process conditions, and values. However, they can be freely changed depending to specific requirements. Accordingly, a metal other than cobalt, which is selected from a group consisting of zirconium (Zr), hafnium (Hf), cobalt (Co), nickel (Ni), palladium (Pd), platinum (Pt), copper (Cu), gold (An), and silver (Ag) can be used as well. The metal may be deposited on the silicon based material by not only sputtering, but also by processes such as Electron Beam (EB) vapor deposition and CVD. The material for the upper connection layer is not only limited to aluminum, but metals other than pure aluminum may be used, such as an aluminum alloy, copper, silver, tungsten, and molybdenum. The base layer for the aluminum layer may be a material other than cobalt having deposited on the interlayer insulating layer 26, and applicable also are refractory metals such as titanium, nickel, tungsten, and molybdenum, as well as precious metals, transition metals, and semiconductors.

As described in the foregoing, the process for forming silicide plugs according to the present invention comprises depositing a metal while maintaining the silicon based material to a predetermined temperature. Accordingly, an excellent metal coverage can be obtained on the silicon based material. Furthermore, the metal can be uniformly diffused into the silicon based material because the metal is allowed to react with the silicon based material while simultaneously depositing the metal on the silicon based material. The diffusion of the metal atoms into the silicon based material occurs actively by adopting this procedure. This uniform diffusion of the metal inside the silicon based material provides, as a result, a uniform depth profile for the resistivity inside the silicide plug which is finally obtained. Furthermore, it also results in a silicide plug having a uniform surface morphology. It further results in the stable formation of silicide plugs inside fine openings.

Conclusively, the silicide having formed uniformly inside the opening to give a silicide plug with a plain surface morphology allows the barrier metal layers and metal connection layers to be formed uniformly, and also prevents the penetration of aluminum alloys and the like from occurring.

While the invention has been described in detail and with reference to specific embodiments thereof, it will be apparent to one skilled in the art that various changes and modifications can be made therein without departing from the spirit and scope thereof.

I claim:

1. A process for forming a silicide plug in a semiconductor device, which comprises the steps of:

forming an opening in an interlayer insulating layer formed on a lower connection layer;

depositing a single layer of a silicon based material on the interlayer insulating layer and inside said opening and then removing any of said silicon based material located above a top pane of said interlayer insulating layer; and depositing a metal layer from the group of metals consisting of zirconium, nickel, palladium, copper, gold and silver on the silicon based material deposited inside the opening while maintaining the silicon based material at a temperature at which said silicon based material reacts with said metal to diffuse the metal into the silicon based material, and thereby form a uniform silicide plug inside the opening through the reaction of said silicon based material and said metal.

2. A process for forming a silicide plug in a semiconductor device as claimed in claim 1, which further comprises the additional steps of:

removing an unreacted portion of the metal layer; and heat treating the silicide plug.

3. The process of forming a silicide plug in a semiconductor device of claim 1, wherein the group of metals further comprises cobalt and hafnium.

* * * * *